(12) United States Patent
Jao

(10) Patent No.: US 8,022,509 B2
(45) Date of Patent: Sep. 20, 2011

(54) CRACK STOPPING STRUCTURE AND METHOD FOR FABRICATING THE SAME

(75) Inventor: Jui-Meng Jao, Miao-Li Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 347 days.

(21) Appl. No.: 12/324,901

(22) Filed: Nov. 28, 2008

(65) Prior Publication Data

US 2010/0133669 A1      Jun. 3, 2010

(51) Int. Cl.
  *H01L 23/52*  (2006.01)
  *H01L 21/78*  (2006.01)
  *H01L 23/02*  (2006.01)

(52) U.S. Cl. ........ 257/620; 257/618; 257/622; 257/669; 257/E23.178; 257/E21.599; 257/E23.141; 257/E23.18

(58) Field of Classification Search .................. 257/618, 257/620, 622, 669, E23.178
See application file for complete search history.

(56) References Cited

U.S. PATENT DOCUMENTS

| 6,951,801 | B2 | 10/2005 | Pozder | |
| 2003/0122220 | A1* | 7/2003 | West et al. | 257/620 |
| 2007/0158788 | A1* | 7/2007 | Yang | 257/620 |
| 2008/0258266 | A1* | 10/2008 | Takemura et al. | 257/620 |
| 2010/0078769 | A1* | 4/2010 | West et al. | 257/620 |
| 2010/0109128 | A1* | 5/2010 | West et al. | 257/620 |

* cited by examiner

*Primary Examiner* — Ken A Parker
*Assistant Examiner* — David Spalla
(74) *Attorney, Agent, or Firm* — Winston Hsu; Scott Margo

(57) ABSTRACT

A crack stopping structure is disclosed. The crack stopping structure includes a semiconductor substrate having a die region, a die seal ring region, and a scribe line region; a metal interconnect structure disposed on the semiconductor substrate of the scribe line region; and a plurality of dielectric layers disposed on the semiconductor substrate of the die region, the die seal ring region, and the scribe line region. The dielectric layers include a first opening exposing the surface of the metal interconnect structure of the scribe line region and a second opening exposing the dielectric layer adjacent to the metal interconnect structure such that the metal interconnect structure and the exposed portion of the dielectric layer form a step.

9 Claims, 3 Drawing Sheets

CRACK STOPPING STRUCTURE AND METHOD FOR FABRICATING THE SAME

BACKGROUND OF THE INVENTION

1. Field of the Invention

The invention relates to a crack stopping structure, and more particularly, to a crack stopping structure disposed on the scribe line of a wafer.

2. Description of the Prior Art

The manufacturing flow of the integrated circuit can be mainly distinguish into three stages as follows: (1) the manufacturing of the wafer, (2) the fabrication of the integrated circuit, and (3) the cutting, electric testing, sorting, and packaging of the integrated circuit. When fabricating the integrated circuit on the wafer, the whole wafer is divided uniformly into many overlapping dies, and the adjacent dies are separated by a scribe line. The cutting step of the integrated circuit utilizes a cutter to cut the wafer into individual dies along the scribe lines.

In recent years, the high integration semiconductor process, with an inter-metal dielectric layer collocated by the dual damascene technology and the use of low dielectric materials, is the most popular metal interconnect technology to date. Due to the low resistance of copper, and the low dielectric material, the RC delay between the metal wires is greatly reduced. However, for achieving low dielectric property, many of low dielectric materials have loose, and weak mechanical strength structures, and are fragile. Therefore a chip crack often occurs from lateral cutting stress while performing wafer dicing. The chip crack damages the die seal ring region of the wafer that protects the die region and induces metal layer delamination. This causes high infant mortality in products, thereby reducing yield in subsequent electric test processes.

SUMMARY OF THE INVENTION

It is an objective of the present invention to provide a crack stopping structure for preventing chip crack produced during dicing of the wafer from damaging the entire die region.

According to a preferred embodiment of the present invention, a crack stopping structure is disclosed. The crack stopping structure includes a semiconductor substrate having a die region, a die seal ring region, and a scribe line region; a metal interconnect structure disposed on the semiconductor substrate of the scribe line region; and a plurality of dielectric layers disposed on the semiconductor substrate of the die region, the die seal ring region, and the scribe line region. The dielectric layers include a first opening exposing the surface of the metal interconnect structure of the scribe line region and a second opening exposing the dielectric layer adjacent to the metal interconnect structure such that the metal interconnect structure and the exposed portion of the dielectric layer form a step.

According to another aspect of the present invention, a method for fabricating a crack stopping structure is disclosed. The method includes the steps of: providing a semiconductor substrate having a die region, a die seal ring region, and a scribe line region; forming a metal interconnect structure on the semiconductor substrate of the scribe line region; forming a dielectric layer on the metal interconnect structure; removing a portion of the dielectric layer to expose the surface of the metal interconnect structure; and performing an etching process by using the exposed surface of the metal interconnect structure as mask for forming an opening adjacent to the metal interconnect structure.

The present invention preferably forms at least an opening adjacent to the metal interconnect structure disposed in the scribe line region of a wafer, in which a step is formed between the surface of the metal interconnect structure and the exposed dielectric layer. The opening is preferably used as a buffering zone to stop crack produced during dicing of the wafer from damaging the inner die seal ring region or even the entire die region. The structure of the present invention could be fabricated in part of the scribe line region diced by dicing tool or in part of the scribe line region not diced by dicing tool. Accordingly, as the crack stopping structure is disposed in the non-diced part of the scribe line region, the structure is preferably used as a buffering medium. As the crack stopping structure is disposed in the dicing part of the scribe line region, the structure could be used to increase the stability of the entire metal interconnect structure, thereby reducing problem such as dicing delamination as the metal interconnect structure is diced by dicing tool.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
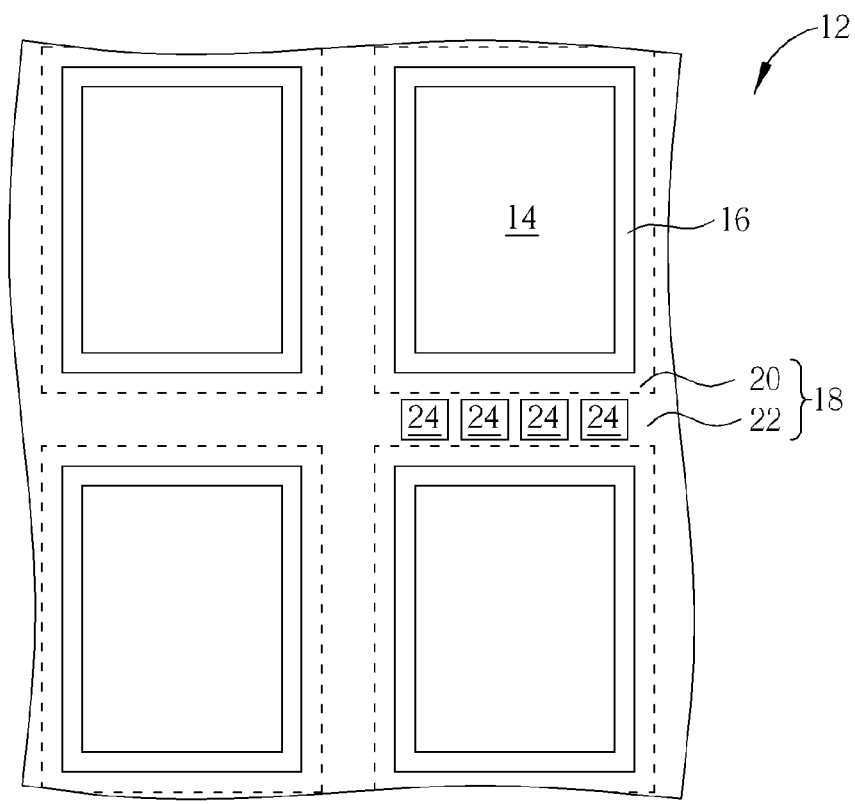
FIG. 1 illustrates a top view of a crack stopping structure according to a preferred embodiment of the present invention.
Figure 2:
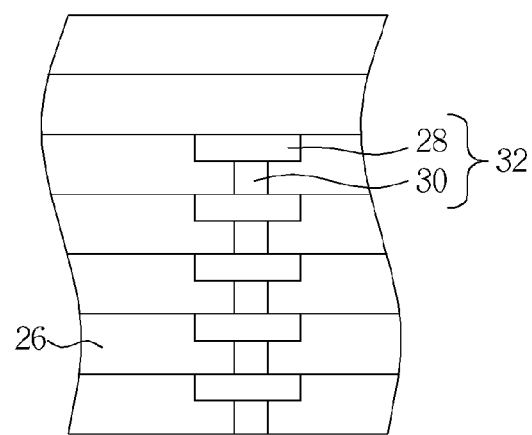
FIGS. 2-4 illustrate cross-sectional views for fabricating a crack stopping structure on the scribe line region of a semiconductor substrate of the present invention.
Figure 3:
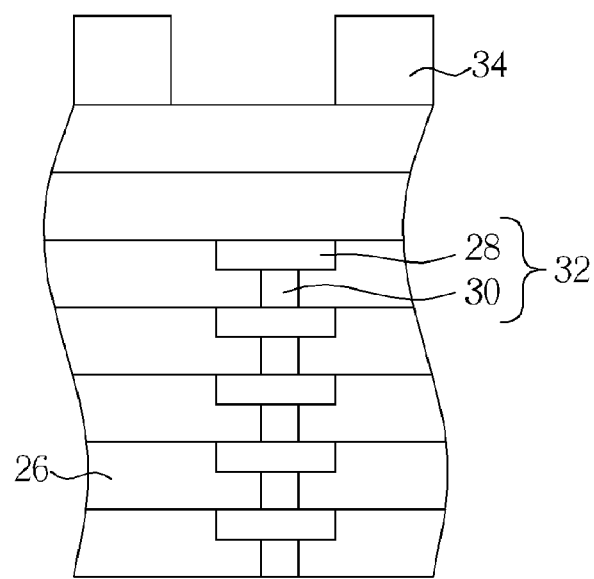
Figure 4:
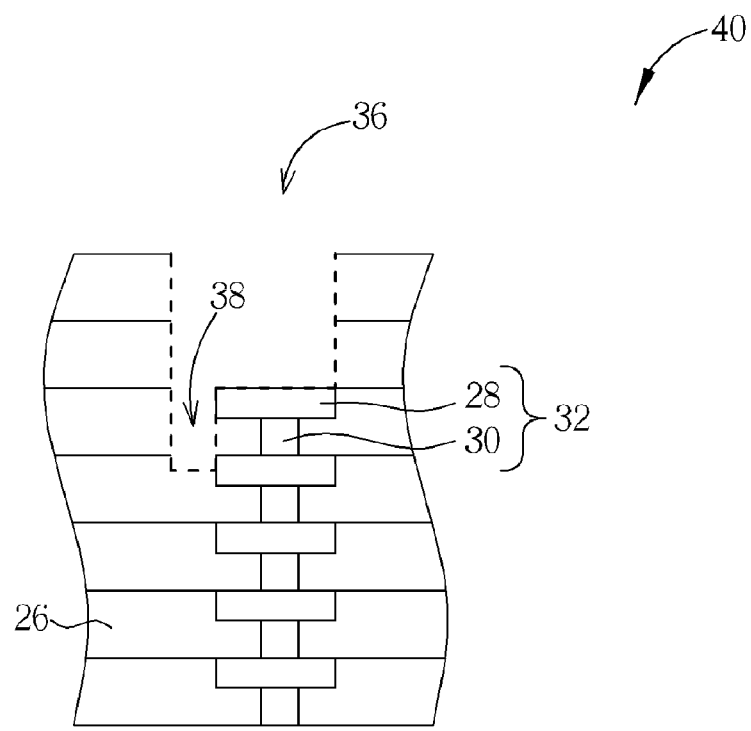

Referring to FIGS. 1-4, FIG. 1 illustrates a top view of a crack stopping structure according to a preferred embodiment of the present invention and FIGS. 2-4 illustrate cross-sectional views for fabricating a crack stopping structure on the scribe line region of a semiconductor substrate of the present invention. As shown in FIG. 1, a semiconductor substrate 12, such as a silicon wafer is provided, in which a die region 14, a die seal ring region 16, and a scribe line region 18 are defined on the semiconductor substrate 12. The scribe lien region 18 is formed on the exterior side of the die region 14 and the die seal ring region 16 and surrounds the entire die seal ring. The die seal ring region 16 is disposed between the die region 14 and the scribe line region 18, such that the die seal ring could be used as a blocking wall for protecting the die region from external stress while the wafer is diced. In this embodiment, the scribe line region 18 is specifically divided into two parts, including a first part 20 and a second part 22. The first part 20 of the scribe line region 18 is adjacent to the die seal ring region 16, in which this part 20 would not be diced by dicing tool while the wafer is diced. The second part 22 is positioned on the exterior side of the first part 20 and a plurality of wafer acceptance test pads 24 are placed on the second part 22 for testing purpose. For illustration purpose, only four pads 24 are shown in FIG. 1. The second part 22 is preferably diced by dicing tool while the wafer is diced along the scribe line region 18.

Next, a standard MOS fabrication could be performed to form plurality of MOS transistors (not shown) in the die region 14. For instance, standard transistor structures including gate electrode, spacer, source/drain region, and silicide layers could be formed on the semiconductor substrate 12. An interlayer dielectric layer (not shown) is then deposited on the transistor of the die region 14 as well as the semiconductor substrate 12 of the die seal ring region 16 and the scribe line region 18. A metal interconnect process is performed to form a plurality of dielectric layers 26 on the interlayer dielectric layer of the die region 14, the die seal ring region 16, and the scribe line region 18 and a plurality of metal interconnect structures 32 composed of patterned metal layer 28 and conductive vias 30 in the dielectric layers 26, as shown in FIG. 2. The metal interconnect structures 32 in the die region 14 are formed to electrically connect the transistor to other external circuits, and the metal interconnect structures 32 in the die seal ring region 16 could be electrically connected to other circuits or only disposed in the dielectric layers 26 for serving as a protective barrier for the die region 14.

For simplicity reason and emphasizing the main feature of the present invention, the fabrication shown in FIGS. 2-4 only displays the metal interconnect structures 32 in the scribe line region 18. As shown in the figures, the metal interconnect structures 32 disposed in the scribe line region 18 are composed of a plurality of patterned metal layers 28 and conductive vias 30. However, the metal interconnect structures 32 in the scribe line region 18 could also include stacked and interlaced arrangement of non-connected patterned metal layers 28 and dielectric layers, which is also within the scope of the present invention.

Next, as shown in FIGS. 3-4, a photo-etching process is conducted on the dielectric layers 26 of the scribe line region 18. For instance, a patterned photoresist 34 could be disposed on the surface of the dielectric layer 26, and an etching process is conducted by using the patterned photoresist 34 as mask to form an opening 36 in the dielectric layer 26 for exposing the top surface of the metal interconnect structure 32 in the scribe line region 18 and a portion of the dielectric layer 26 adjacent to the metal interconnect structure 32.

Another etching process is then conducted by using the exposed metal interconnect structure 32 as a mask to remove a portion of the dielectric layer 26 adjacent to the metal interconnect structure 32. This etching preferably forms an opening 38 to expose the sidewall portion of the patterned metal layer 28, such that the exposed upper surface of the metal interconnect structure 32 and the dielectric layer 26 at the bottom of the opening 38 form a step-shaped opening. After stripping the patterned photoresist 34, a crack stopping structure 40 is completed.

In addition to the aforementioned embodiment of using two-step etching process to form the openings 36 and 38, one single etching approach could also be conducted to form these two openings 36 and 38. For instance, an etching could be performed by using the photoresist 34 as a mask to remove a portion of the dielectric layer 26 above the metal layer 28. Preferably, the etching is continued after exposing the surface of the metal layer 28 to remove the dielectric layer 26 adjacent to the metal layer 28 until in-situly forming the openings 36 and 38.

It should be noted that the crack stopping structure 40 of the present invention could be fabricated on the first part 20 of the scribe line region 18, on the second part 22 of the scribe line region 22, or on both the first part 20 and second part 22 of the scribe line region 18.

Preferably, when the crack stopping structure 40 is formed in the first part 20, the structure 40 is not diced by dicing tool while the wafer is diced, and the opening 38 situated adjacent to the metal interconnect structure 32 could be used as a buffering zone to stop the crack produced by the dicing of the wafer from extending into the die seal ring region 16 or even affecting the die region 14.

When the crack stopping structure 40 is formed in the second part 22 of the scribe line region 18, the structure 40 is preferably used as a sacrificing structure. In this embodiment, the area of the patterned metal layer 28 is substantially equal to the area of the wafer testing pad 24 and the entire metal interconnect structure 32 from top to bottom is fabricated by one single material while the structure 40 is fabricated in the second part 22 of the scribe line region 18. For instance, when the external pads of the metal interconnect structure 32 is composed of two different material such as copper and aluminum, a photo-etching process could be first conducted to remove the top aluminum portion and expose the copper metal disposed underneath, thereby forming a structure composed of entirely copper. By using this design, the stability of the second par 22 of the scribe line region 18 is significantly increased, thereby further reducing problem such as dicing delamination as the metal interconnect structure 32 is diced by dicing tool.

According to an embodiment of the present invention, the position of the opening 38 adjacent to the metal interconnect structure 32 could be adjust according to the demand of the product. For instance, the opening 38 could be formed adjacent to a side of the die seal ring region 16, adjacent to a side opposite to the die seal ring region 16, or on both sides of the metal interconnect structure 32.

Figure 5:
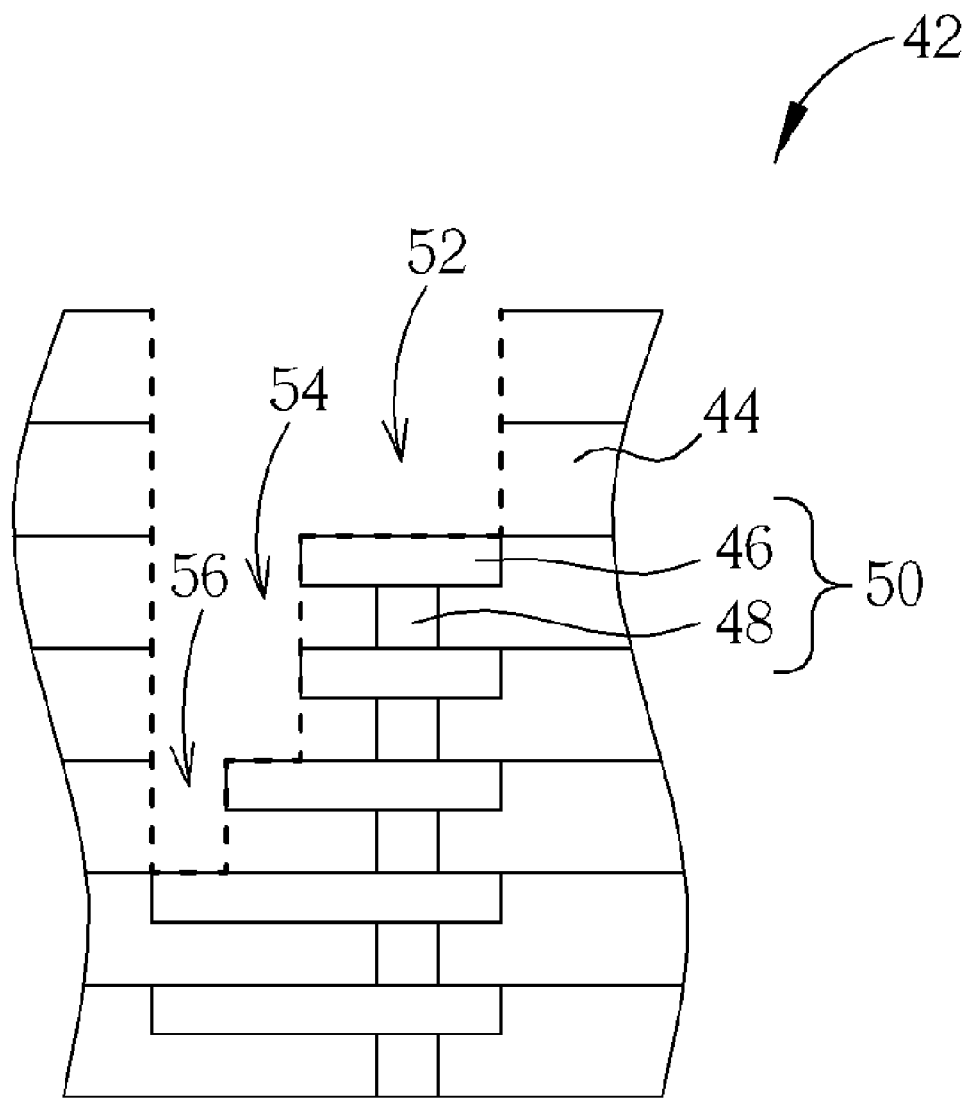
FIG. 5 illustrates a perspective view of a crack stopping structure according to an embodiment of the present invention.

Referring to FIG. 5, FIG. 5 illustrates a perspective view of a crack stopping structure 42 according to an embodiment of the present invention. As shown in FIG. 5, a similar metal interconnect process is conducted to form a metal interconnect structure 50 in the dielectric layer 44 of the scribe line region 18. In this embodiment, the metal interconnect structure 50 is composed of a plurality of patterned metal layers 46 and conductive vias 48 connected to the metal layers 46, and the area of the patterned metal layers 46 is substantially decreased from bottom to top. For instance, the area of the first level patterned metal layer 46 (such as the top level of the metal layer 46) and the second level patterned metal layer 46 is smaller than the area of the third level patterned metal layer 46, and the area of the third level patterned metal layer 46 is further smaller than the area of the fourth and fifth level patterned metal layers 46. Despite five different patterned metal layers 46 and five conductive vias 48 connecting the metal layers 46 are proposed in this embodiment, the area and number of patterned metal layers 46 and conductive vias 48 could be adjusted according to the demand of the product, which is also within the scope of the present invention.

A patterned photoresist (not shown) is then formed on the surface of the dielectric layer 44, and an etching process is conducted by using the patterned photoresist as mask to form an opening 52 in the dielectric layer 44 for exposing the surface of the first level patterned metal layer 46 and a portion of the dielectric layer (not shown) adjacent to the first level patterned metal layer 46.

An etching process is performed by using the exposed portion of the first level patterned metal layer 46 as mask to form an opening 54 adjacent to the first level and second level metal layers 46 while exposing a portion of the top surface of the third level patterned metal layer 46. Another etching process is conducted thereafter by using the exposed portion of the first level and third level patterned metal layer 46 to form an opening 56 adjacent to the third level patterned metal layer 46 while exposing a portion of the fourth level patterned metal layer 46. As shown in FIG. 5, as the area of the upper level metal layers is substantially smaller than the area of the lower level metal layers, a step-shaped opening is formed by the exposed upper surface of the metal interconnect structure 50 and the dielectric layer 44 at the bottom of the openings 54, 56. This completes a crack stopping structure 42 according to another embodiment of the present invention.

Similar to the embodiment shown in FIGS. 2-3, this embodiment could also be accomplished by using a single etching approach to form the openings 52, 54, 56. For instance, a patterned photoresist (not shown) could be formed on the surface of the dielectric layer 44 and an etching is conducted to first remove a portion of the dielectric layer 44 and expose the surface of the first metal layer 46. Preferably, the etching is continued after exposing the first metal layer 46 surface to remove the dielectric layer 44 adjacent to the first metal layer 46 until in-situly forming the openings 52, 54, 56.

Overall, the present invention forms at least an opening adjacent to the metal interconnect structure disposed in the scribe line region of a wafer, in which a step is formed between the surface of the metal interconnect structure and the exposed dielectric layer. The opening is preferably used as a buffering zone to stop crack produced during dicing of the wafer from affecting the inner die seal ring region or even the entire die region. The structure of the present invention could be fabricated in part of the scribe line region diced by dicing tool or in part of the scribe line region not diced by dicing tool. Accordingly, as the crack stopping structure is disposed in the non-diced part of the scribe line region, the structure is preferably used as a buffering medium. As the crack stopping structure is disposed in the dicing part of the scribe line region, the structure could be used to increase the stability of the entire metal interconnect structure, thereby reducing problem such as dicing delamination as the metal interconnect structure is diced by dicing tool.

Those skilled in the art will readily observe that numerous modifications and alterations of the device and method may be made while retaining the teachings of the invention.

What is claimed is:

1. A crack stopping structure, comprising:
   a semiconductor substrate having a die region, a die seal ring region, and a scribe line region;
   a metal interconnect structure disposed on the semiconductor substrate of the scribe line region; and
   a plurality of dielectric layers disposed on the semiconductor substrate of the die region, the die seal ring region, and the scribe line region, wherein the dielectric layers comprise a first opening exposing the surface of the metal interconnect structure of the scribe line region and a second opening exposing the dielectric layer adjacent to the metal interconnect structure such that the metal interconnect structure and the exposed portion of the dielectric layer form a step.

2. The crack stopping structure of claim 1, wherein the scribe line region comprises a first part not diced by dicing tool and a second part diced by dicing tool.

3. The crack stopping structure of claim 2, wherein the metal interconnect structure is disposed in the first part of the scribe line region.

4. The crack stopping structure of claim 2, wherein the metal interconnect structure is disposed in the second part of the scribe line region.

5. The crack stopping structure of claim 4, wherein the metal interconnect structure comprises one single material.

6. The crack stopping structure of claim 5, wherein the one single material comprises copper.

7. The crack stopping structure of claim 1, wherein the second opening is adjacent to a side of the scribe line region.

8. The crack stopping structure of claim 1, wherein the second opening is adjacent to a side of the die seal ring region.

9. The crack stopping structure of claim 1, wherein the second opening is adjacent to a side of the scribe line region and adjacent to a side of the die seal ring region.

* * * * *